US008938578B2

(12) United States Patent
Gopalakrishnan et al.

(10) Patent No.: US 8,938,578 B2
(45) Date of Patent: Jan. 20, 2015

(54) MEMORY DEVICE WITH MULTI-MODE DESERIALIZER

(71) Applicant: Rambus Inc., Sunnyvale, CA (US)

(72) Inventors: Liji Gopalakrishnan, Sunnyvale, CA (US); Renu Rangnekar, Bangalore (IN)

(73) Assignee: Rambus Inc., Sunnyvale, CA (US)

(*) Notice: Subject to any disclaimer, the term of this patent is extended or adjusted under 35 U.S.C. 154(b) by 44 days.

(21) Appl. No.: 13/936,777

(22) Filed: Jul. 8, 2013

(65) Prior Publication Data

US 2014/0029331 A1   Jan. 30, 2014

Related U.S. Application Data

(60) Provisional application No. 61/676,574, filed on Jul. 27, 2012.

(51) Int. Cl.
G06F 12/00 (2006.01)
G11C 11/4063 (2006.01)
G11C 7/10 (2006.01)

(52) U.S. Cl.
CPC .......... *G11C 11/4063* (2013.01); *G11C 7/1012* (2013.01); *G11C 7/106* (2013.01); *G11C 7/1066* (2013.01); *G11C 7/1087* (2013.01); *G11C 7/1093* (2013.01)

USPC .......................................... 711/105; 711/154

(58) Field of Classification Search
USPC ........... 711/105, 154; 365/189.12, 191, 233.1
See application file for complete search history.

(56) References Cited

U.S. PATENT DOCUMENTS

| 4,429,300 A * | 1/1984 | Yamasawa et al. ........... 341/100 |
| 7,587,537 B1 * | 9/2009 | Burney ........................... 710/71 |
| 2012/0117317 A1 * | 5/2012 | Sheffler et al. ................. 711/103 |

* cited by examiner

*Primary Examiner* — Vu Le
(74) *Attorney, Agent, or Firm* — Lance Kreisman; Peninsula Patent Group (57) ABSTRACT

An integrated circuit memory device is disclosed. The memory device includes a memory core having a timing input to receive a clock signal. An interface couples to the memory core. The interface includes a receiver to receive a serial stream of write data bits and a sampler clocked by a strobe signal to generate serialized write data. The interface also includes a deserializer and control logic. The deserializer includes an input to receive the serialized write data and an output to generate parallel data responsive to a control signal generated by the control logic. In a first mode of operation, the control logic generates the control signal with respect to the clock signal. In a second mode of operation, the control logic generates the control signal with respect to the strobe signal.

18 Claims, 5 Drawing Sheets

MEMORY DEVICE WITH MULTI-MODE DESERIALIZER

RELATED APPLICATIONS

This application claims the benefit of priority under 35 U.S.C. 119(e) to Provisional Application No. 61/676,574, filed Jul. 27, 2012, entitled MEMORY DEVICE WITH MULTI-MODE DESERIALIZER, which is incorporated by reference in its entirety for all purposes.

TECHNICAL FIELD

The disclosure herein relates to memory systems, and more specifically to methods and apparatus for memory write operations.

BACKGROUND

Write data transfers for DRAM memory systems generally involve transmitting serialized streams of data from a memory controller to one or more DRAM devices. At the device, the serial streams are deserialized and fed to a memory core for storage in address-specified locations. Low-power DRAMs, such as LPDDR (and its variants), omit and employ various features that impact the timing of write data transfer operations.

For example, low-power DRAMs typically omit the use of an on-chip delay-locked-loop (DLL) for timing synchronization. The memory device's timing reference is thus obtained from an off-chip system clock or command clock. Further, low power DRAMs generally provide the ability to transfer data at one of several possible data rates. For relatively low data rates, write data is accompanied by a strobe timing reference having a preamble component that is set to a relatively short interval width. Faster data rates often use a strobe having a preamble with a longer length in order to meet timing constraints. Complicating matters further, the data strobe and system clock signals are referenced to the same clock domain, but traverse different paths on and off chip. While the data is referenced to the strobe signal, the command input and various control signals on the DRAM are referenced to the system clock or command clock. The two clocks can vary with respect to each other by up to a quarter clock cycle. This may pose problems in maintaining proper timing accuracy for write operations at the various data rates.

Thus, the need exists for an improved DRAM timing scheme for memory write operations that can minimize power dissipation while maximizing timing accuracy.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of an integrated circuit memory device are disclosed. In one embodiment, the memory device includes a memory core having a timing input to receive a clock signal originating from a clock timing domain. An interface couples to the memory core. The interface includes a receiver to receive a serial stream of write data bits and a sampler clocked by a strobe signal to sample serialized write data. The strobe signal originates from a strobe timing domain. The interface also includes a deserializer and control logic. The deserializer includes an input to receive the serialized write data and an output to generate parallel data responsive to a control signal generated by the control logic. In a first mode of operation, the control logic generates the control signal with respect to the command clock timing domain. In a second mode of operation, the control logic generates the control signal with respect to the strobe timing domain.

In a further embodiment, an integrated circuit memory controller is disclosed. The memory controller includes clock generation circuitry, strobe generation circuitry, and transmit circuitry. The clock generation circuitry is operable to generate and transmit a clock signal to a DRAM. The strobe generation circuitry generates and transmits a strobe signal to the DRAM to accompany write data. The transmit circuitry transmits a mode select signal to the DRAM, the mode select signal having a first value indicating a first mode of operation, and a second value indicating a second mode of operation. The first mode of operation corresponds to the write data being stored in the DRAM based on a control signal referenced to the first timing domain, while the second mode of operation corresponds to the write data being stored in the DRAM based on the control signal being referenced to the second timing domain.

Figure 1:
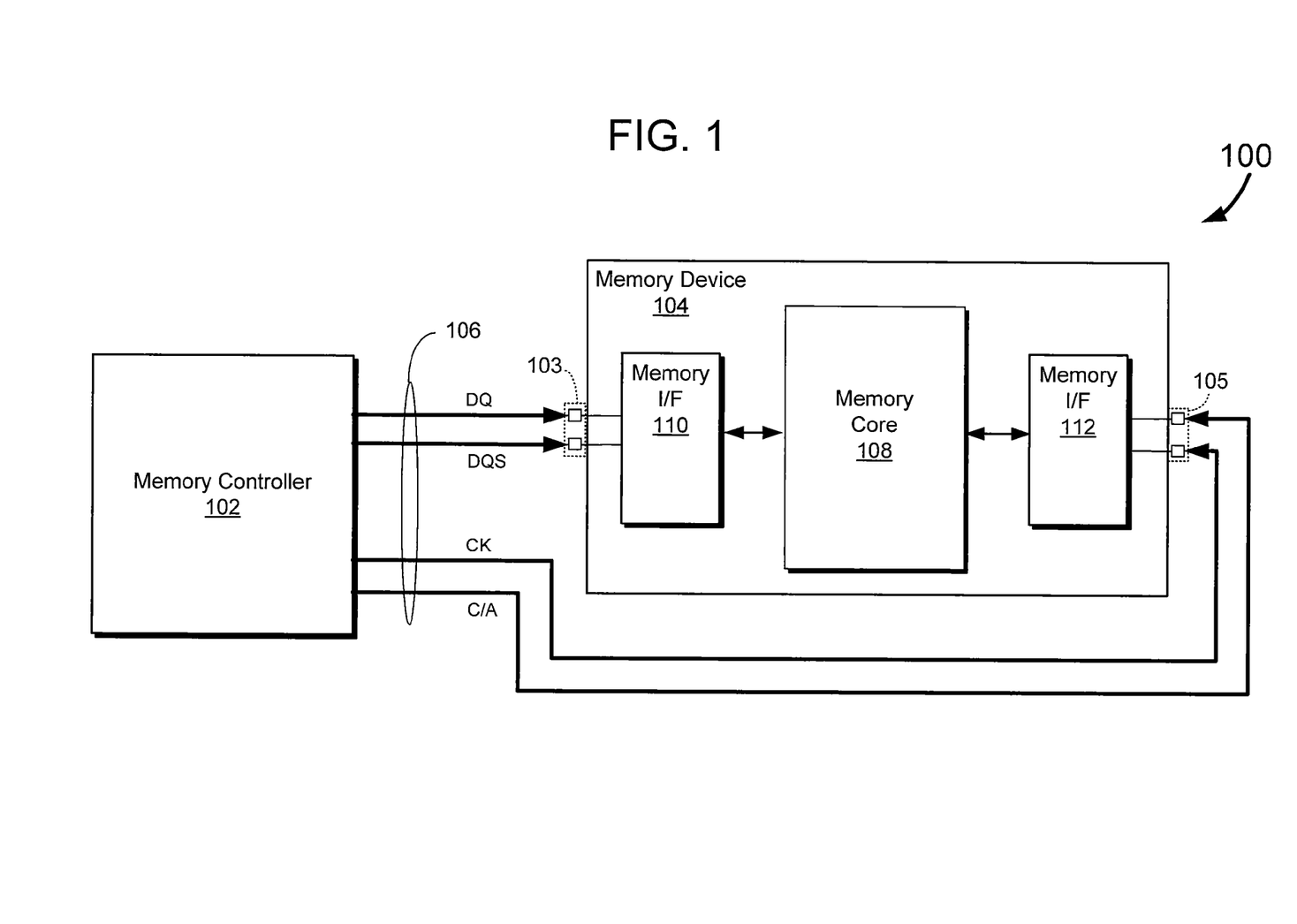
FIG. 1 illustrates a block diagram of a memory system according to one embodiment.

FIG. 1 illustrates one embodiment of a memory system 100 that is optimized for low-power operation. The system employs a memory controller 102 in the form of an integrated circuit chip coupled to a memory device 104, also in integrated circuit chip form. The memory device in one embodiment is a dynamic random access memory (DRAM), and in further embodiments is realized as an LPDDR-type DRAM. The chips are interconnected via plural signal paths 106 that transfer respective data (DQ), strobe (DQS), clock (CK), and control/address (C/A) signals between the chips. In one embodiment, the data DQ and strobe DQS signals are routed from the controller 102 to a first set of I/O pins 103 disposed on a first edge of the memory device 104, and the clock CK and control/address C/A signals are routed to a second set of pins 105 that are positioned on a second edge of the memory device 104 opposite the first edge.

Further referring to FIG. 1, the memory device 104 generally includes a memory core 108 and interface circuitry 110 and 112. Generally, the interface circuitry provides the physical interface that receives the write data from the memory controller and arranges the data in a manner suitable for transfer into the memory core 108. The interface thus interacts with the data DQ, strobe DQS, clock CK and control/address C/A signals. While the interface circuitry is shown as separate blocks in FIG. 1, as a practical matter, the interface circuitry may be distributed across the memory device in an optimal manner depending on the ingress/egress of signals to and from the memory device 104.

One implication from the routing of the control/address CA and clock CK signals to an edge of the memory device 104 different than the edge routing of the data DQ and strobe DQS signals involves the time of flight of the various signals. The longer path involved with the control/address C/A and clock CK signals results in a delay with respect to the data DQ and strobe DQS signals at the DQS to CK domain crossing interface. As more fully described below, the interface circuitry 110 employs circuitry to compensate for the time of flight delay, and other timing-related aspects to maximize timing margin in transferring domain from the received strobe signal to command clock for low-power operation.

Figure 2:
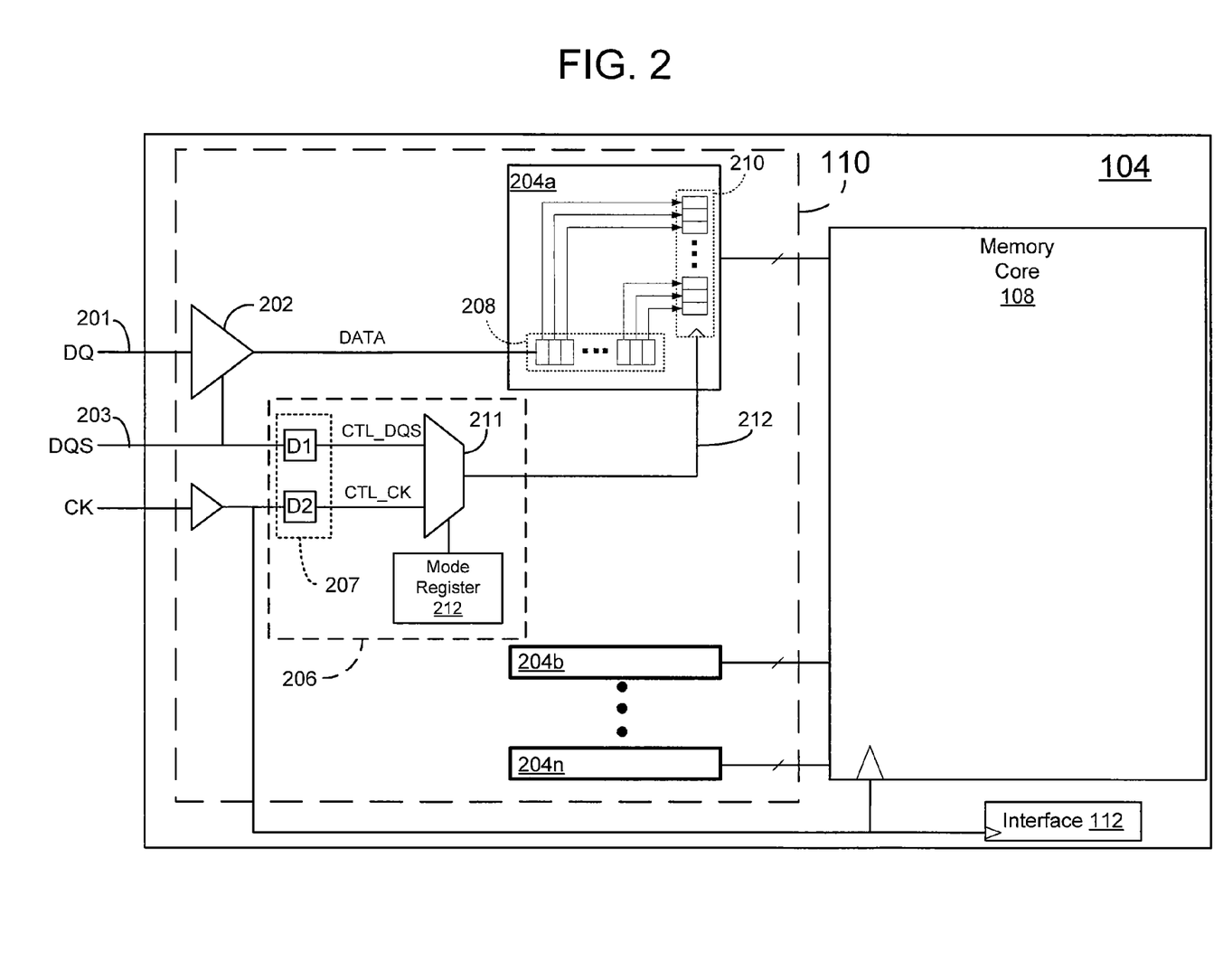
FIG. 2 illustrates a block diagram of one embodiment of the memory device interface circuitry of FIG. 1.

FIG. 2 illustrates further detail of one embodiment of the interface circuitry 110 and its relationship between the memory core 108 and the incoming data DQ, strobe DQS and clock CK signals involved in write operations for a single data path 201. For purposes of clarity, a control/address signal path is not shown. The interface circuitry 110 includes receiver circuitry 202 that receives serialized write data signals DQ from the data path 201 and samples the data in response to an accompanying strobe signal DQS from a strobe signal path 203 to generate sampled data DATA. While only one data path 201 is shown with an accompanying strobe path 203, the interface circuitry 110 interfaces with plural data paths (not shown) that in some embodiments may share a single strobe signal and in other embodiments may be associated with separate strobe signals.

With continued reference to FIG. 2, a deserializer circuit 204a receives the sampled write data stream from the output of the receiver circuitry 202 and carries out a serial-to-parallel conversion on the data, as more fully described below. The deserializer 204a couples to a selector circuit 206 that feeds an appropriate control signal for loading data for transfer from the deserializer 210 to the memory core 108 depending on the mode of operation of the memory device 104. Additional deserializers 204b-204n are provided to support deserialization of write data from additional data paths (not shown).

Further referring to FIG. 2, in one embodiment, the deserializer 204a takes the form of a serial-to-parallel shift register having a 1-bit wide and 8-bit deep input interface 208 for each sampled data path to load serialized bytes of sampled data DATA. The deserializer 204 shifts the bits out along an 8-bit wide and 1-bit deep output interface 210 to generate a parallel byte. Loading of the parallel byte for transfer to the memory core 108 occurs in response to a control signal from the selector circuit 206. As more fully described below, to optimize the timing margin for write data transfers, the control signal originates from one of two timing domains associated with either the clock signal CK or the strobe signal DQS based on the memory device mode of operation.

With continued reference to FIG. 2, the selector circuit 206 in one embodiment includes delay circuitry 207 that employs respective programmable delay elements D1 and D2 to compensate for a certain amount of skew between the clock CK and strobe DQS signals. The delay settings may be determined, e.g., as part of an initialization routine at system boot-up. The outputs from the delay elements thus represent respective delayed versions of the strobe CTL_DQS and the clock CTL_CK signals. These signals are fed as separate inputs to a multiplexer 211 having a control input that responds to a mode control signal stored in a mode register 212. Depending on the mode control signal, the multiplexer either outputs the clock-based control signal CTL_CK or the strobe-based control signal CTL_DQS along a control path 212 to a timing input of the deserializer output interface 210.

As noted above, the write data interface of memory device 104 at any given time operates in one of at least two modes of operation. The selection between the modes generally depends on the memory device data rate. For LPDDR-type devices, write data rates up to 1.6 Gb/s often employ a strobe signal DQS with a preamble time duration that is approximately 0.35 $t_{CK}$ (where $t_{CK}$ represents the duration of a command clock time interval). With such a fractional clock period (<0.5*tCK) preamble, accurate gating of the strobe is difficult, but for such slower clock rates, direct domain transfer from DQS to CK is possible. Hence utilizing a control signal that originates in the clock timing domain, such as CTL_CK, for loading the output parallel register 210 can provide sufficient timing margin only for data rates up to about 1.6 Gb/s. In contrast, for data rates significantly above 1.6 Gb/s (for example, 3.2 Gb/s), using a wider preamble (e.g., approximately 0.8 $t_{CK}$ or 0.9 $t_{CK}$) allows the strobe to be gated prior to the valid preamble window. As a result, utilizing a control signal that originates in the strobe timing domain, such as CTL_DQS, is possible and provides optimal timing margin. The mode control signal thus plays an important role in optimizing the timing for the memory device 104 under a variety of operating scenarios.

While most of the description above relates to the memory device 104, the memory controller 102 plays a role in the multi-mode write operations by generating and providing the timing references (strobe DQS and clock CK) and issuing commands to load a particular value for the mode bit into the mode register 212, e.g., as appropriate for a current data rate. The controller 102 also includes strobe generation circuitry (not shown) that generates strobe signals DQS with varying preamble durations, depending on the mode.

Figure 3:
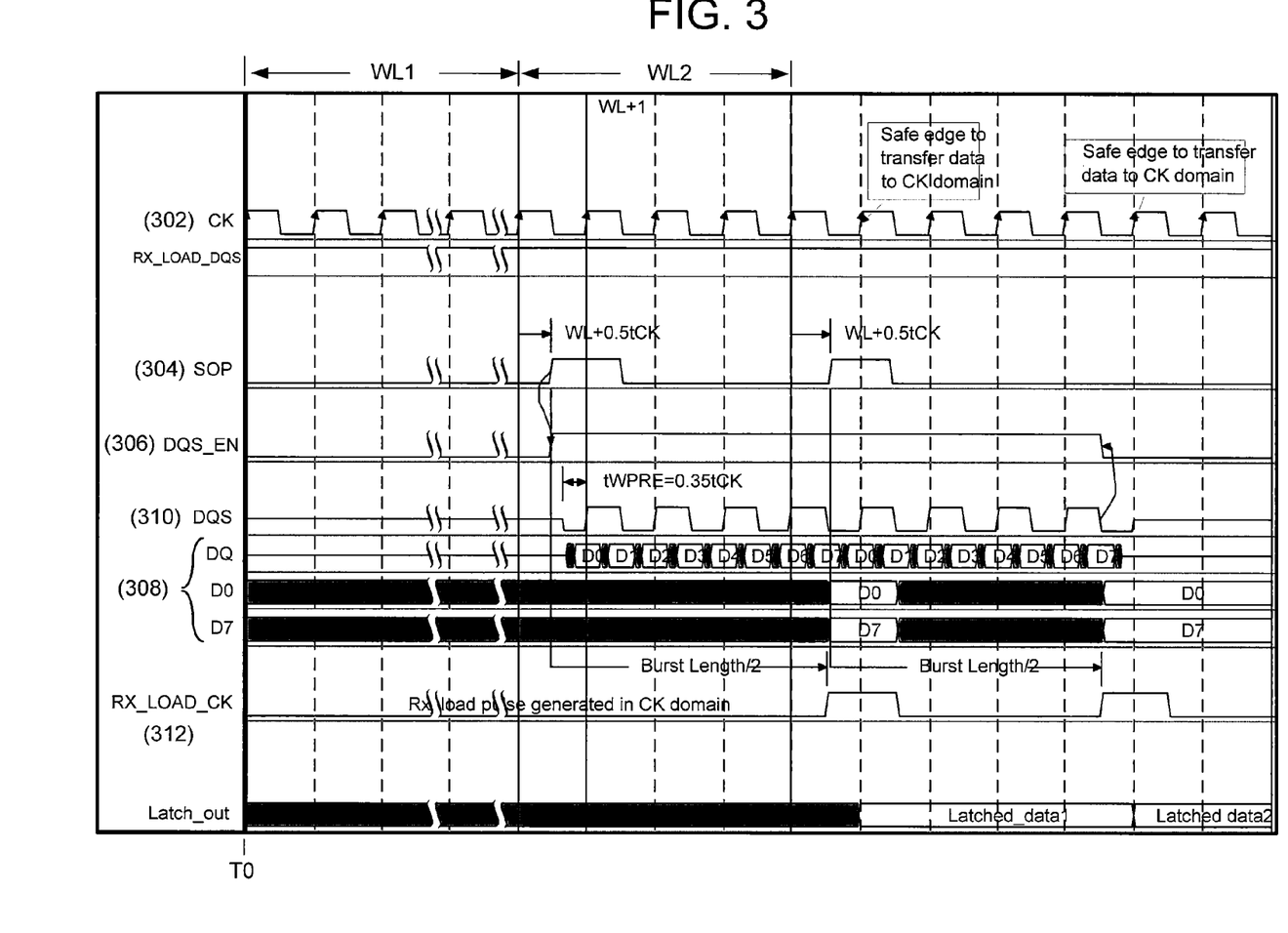
FIG. 3 illustrates a timing chart relating to one mode of operation of the interface circuit of FIG. 2.

FIG. 3 illustrates a timing chart reflecting waveforms under ideal conditions from the perspective of the memory device 104. The chart illustrates various timing interrelationships between timing parameters in the first mode of operation (up to 1.6 Gb/s) for a specific embodiment of the memory system 100 of FIG. 1. For this mode, the memory controller 102 generates strobe signals DQS that exhibit a relatively short preamble component, such as 0.35*$t_{CK}$, where $t_{CK}$ is one interval of the clock signal CK. Further, the first mode may have a pre-programmed write latency WL in terms of an integral number of clock cycles. Since the write data DQ and strobe DQS are received by the memory device with this latency, or delay, the device applies similar delay to the control signals, such as a start of packet SOP and strobe enable signals DQS_EN. For the timing chart of FIG. 3, a write latency value of four clock cycles is applied to the data and control signals shown in the chart.

Further referring to FIG. 3, the top-most waveform at 302 represents the clock CK signal received by the DRAM 104 from the memory controller 102. Following a programmed first write latency WL1 value of four clock cycles and a further half clock delay, referenced from an initial reference point T0, respective "start of packet" SOP and strobe enable DQS_EN signals, at 304 and 306, are initiated to alert and enable the DRAM receiver circuitry to receive an incoming burst of write data. The start of packet and strobe enable signals are both synchronized, or edge-aligned, to the clock CK. Once enabled, the receiver circuitry 202 is able to receive data DQ, shown at 308, into the deserializer input shift register (D0-D7) 208 in response to rising and falling edges of the strobe signal DQS, at 310. As shown in the timing chart, the preamble component $t_{WPRE}$ for the strobe signal exhibits a duration of 0.35*$t_{CK}$.

With continued reference to FIGS. 2 and 3, the received write data accumulates in the deserializer output parallel interface 210 until receipt of a control signal RX_LOAD_CK at 312. The control signal RX_LOAD_CK, when asserted, latches data from serial register 208 into parallel register 210, and corresponds to the clock-based control signal described earlier that is synchronized to the clock signal CK. The loading operation allows the next edge of CK to clock the parallel byte out to the memory core 108 (Latch_out data). As explained above, the control signal is selected based upon the mode control signal stored in the mode register 212.

In some embodiments, the memory device 104 may exhibit variations in early/late timing behavior (where the strobe DQS and data DQ timings vary with respect to the clock CK) up to a quarter clock cycle. This is especially true for LPDDR-type devices that rely on a clock that is generated off-chip. With such variations in timing margin, the domain crossing scheme described above allows for write data timing while domain crossing from the strobe domain to the clock domain with optimal results for 1.6 Gbps and below data rates.

Figure 4:
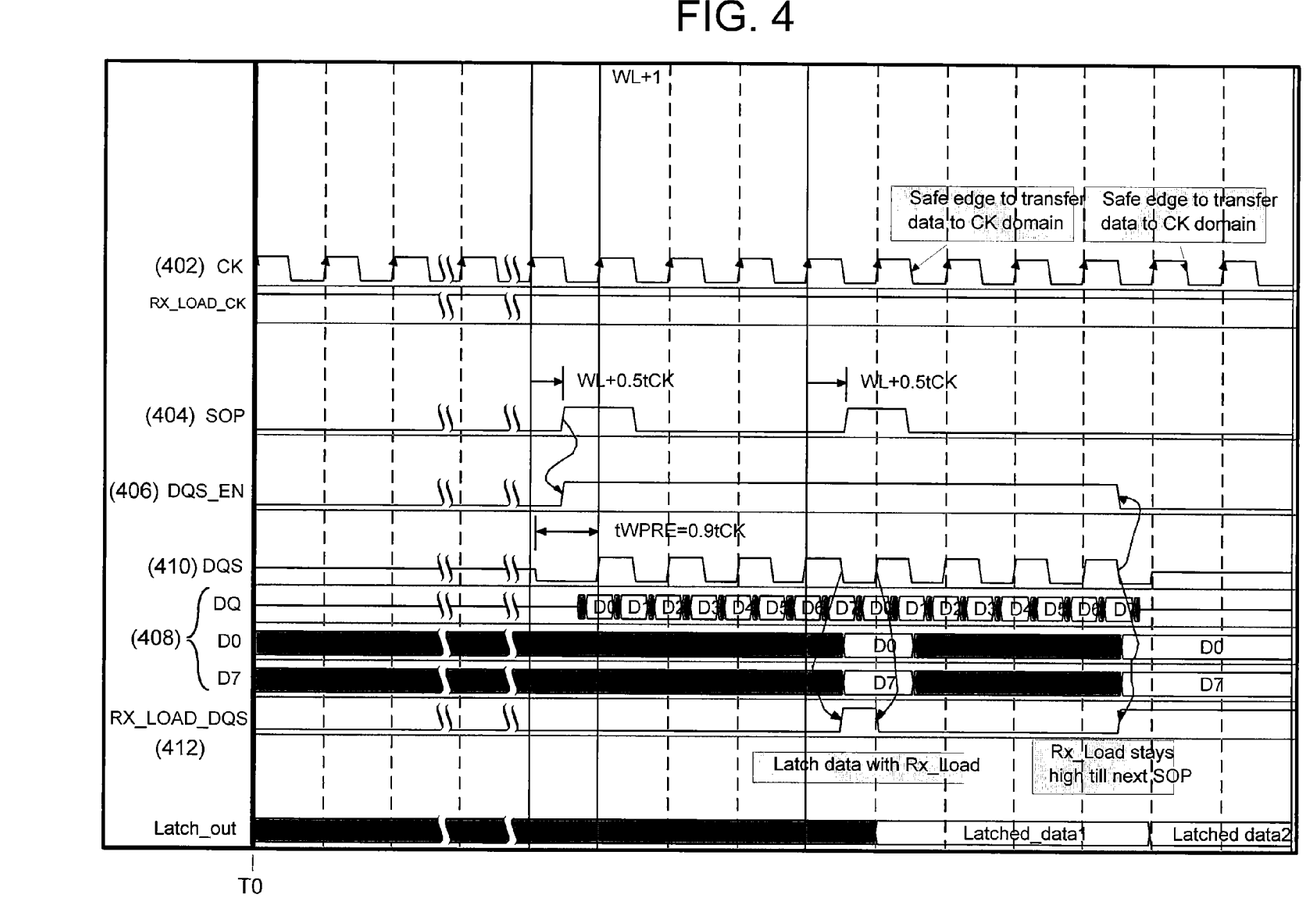
FIG. 4 illustrates a timing chart relating to a second mode of operation of the interface circuit of FIG. 2.

FIG. 4 illustrates a timing chart for a specific embodiment of the memory system 100 of FIG. 1 that corresponds to the second (above 1.6 Gb/s) mode of operation described above. In the second mode of operation, the data rate is significantly higher, and the timing margins to correctly sample and process received write data correspondingly tighter. The second mode may either be initiated as a result of the memory controller 102 determining optimal data rates for operation, or during system operation as a result of changes in peak operating performance demands. In either event, the memory controller 102 can determine the proper mode of operation and issues a form of write enable command for writing an appropriate mode control value into the mode register 212. Alternately, for systems that switch between data rates during operation, the mode register 212 contents can be varied by the memory device itself, based, e.g., on the current operating frequency and a pre-negotiated protocol switch point understood by both the memory controller and the memory device.

Similar to the chart of FIG. 3, the timing chart of FIG. 4 presents a clock waveform CK at 402, and respective "start of packet" SOP and strobe enable DQS_EN signals at 404 and 406 that enable the receiver circuitry to accept write data in response to strobe signal edges.

Further referring to FIG. 4, the strobe signal DQS for the second mode of operation exhibits a longer preamble interval $t_{WPRE}$ (at least with respect to the clock signal CK) than that of the first mode, having an interval of $0.9*t_{CK}$ versus $0.35*t_{CK}$. This additional time provides compensation for the time of flight delays incurred by the enable signals in comparison to the data DQ and strobe DQS signals. The compensation thus allows for the receiver circuitry to be enabled for accurate gating of incoming strobe before data DQ, at 408, gets clocked into the receiver circuitry by the strobe signal DQS edges, at 410. Ideally, the resulting timing alignment between the start of packet SOP and the strobe enable signal with the strobe preamble is to have the rising edges of the control signals aligned midway through the preamble interval.

With continued reference to FIG. 4, the received write data accumulates in the deserializer output parallel interface 210 until receipt of a control signal RX_LOAD_DQS at 412. The control signal RX_LOAD_DQS, when asserted, latches data from serial register 208 into parallel register 210, and corresponds to the strobe-based control signal described earlier that is synchronized to the strobe signal DQS. The loading operation allows the next edge of CK to clock the parallel byte out to the memory core 108 (Latch_out data). In this way, if the data DQ timing drifts with respect to the clock CK, the strobe DQS drifts accordingly to maintain maximum timing margin for the parallel register latch operation.

Figure 5:
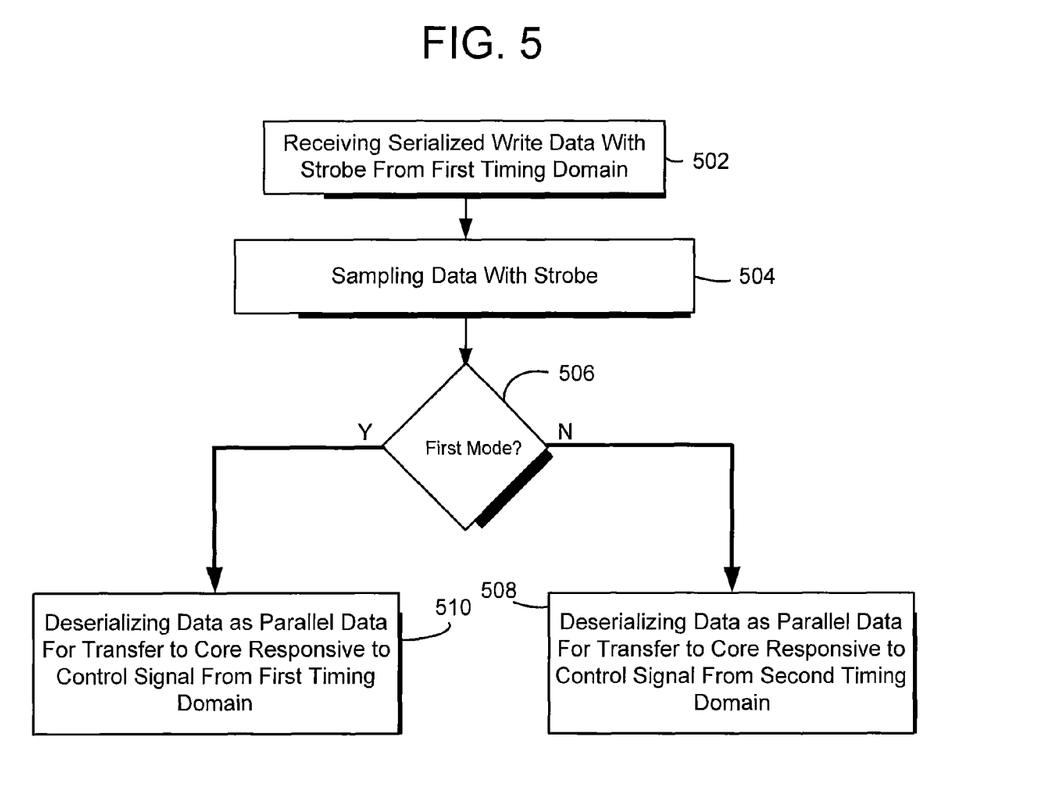
FIG. 5 illustrates a flowchart identifying steps employed in one embodiment of a method of operating the memory device of FIGS. 1 and 2.

FIG. 5 illustrates a flowchart that identifies steps involved in one embodiment of a method of operating the memory device 104 consistent with the hardware described above. Prior to normal operation and/or at intermediate calibration points or frequency-shifting points, in one embodiment the system undergoes an initialization routine to carry out write leveling operations and allow for the memory controller 102 to determine optimum data rates and hardware configurations. One determination involves the mode of operation to run for write data transfers. Once the mode is determined, the memory controller writes a control bit into the mode control register 212. The memory device 104 subsequently accesses the mode bit during operation to determine what mode to run in while receiving write data.

For write operations during normal operation, the memory controller 102 transmits write data in a serialized stream along a given data path with an accompanying strobe signal generated in a strobe timing domain. Depending on topology, a given strobe signal may accompany a single data path or be shared by multiple data paths. The write data signals DQ and the strobe signals DQS are received by the memory device at step 502. The data is sampled in response to the strobe signal, at 504, and passed on to the deserializer 204a for a serial-to-parallel conversion prior to transfer to the memory core 108.

Further referring to FIG. 5, the timing associated with the creation of parallel data by the deserializer 204a for use by the memory core 108 depends on the memory device mode of operation, as discussed above. The memory device determines the mode, at 506, by accessing the mode control bit indicating write data transfers from the memory controller. If the bit reflects the first mode of operation, the control signal selected to deserialize data within the deserializer 204a for use by the memory core 108 originates from the clock timing domain, at step 510. In the event the determination at 506 indicates the second mode of operation, the control signal used to deserialize data within the deserializer 204a for use by the memory core 108 originates from the strobe timing domain.

Those skilled in the art will appreciate the many benefits and advantages afforded by the embodiments presented herein. By providing multiple modes of operation for a deserializer involved in write data operations, timing margins associated with low-power memory devices may be optimized, thus reducing incidents where inaccurate data transfers occur. The write bandwidth penalty caused by the wider preamble can be avoided at lower data rates, while also allowing the device to function at higher data rates as required.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit memory device comprising:
    a memory core having a timing input referenced to a clock signal;
    an interface coupled to the memory core, the interface including
        a receiver to receive a serial stream of write data bits and including a sampler clocked with reference to a strobe signal to output sampled serial write data,
        a deserializer having an input to receive the sampled serial write data and convert the sampled serial write data to parallel output data responsive to a control signal, and
        control logic operable to generate the control signal;
    wherein the control logic generates the control signal with reference to the clock signal for a first mode of operation; and
    wherein the control logic generates the control signal with reference to the strobe signal in a second mode of operation.

2. The integrated circuit memory device of claim 1 wherein:
    the control logic generates the control signal based on a value of a mode select signal.

3. The integrated circuit memory device of claim 2 wherein:
    the control logic includes a register, the register including storage for storing the mode select signal.

4. The integrated circuit memory device of claim 1 wherein:
    for the first mode of operation, the strobe signal exhibits a first preamble component of a first time duration, measured in clock cycles of the clock signal; and
    for the second mode of operation, the strobe signal exhibits a second preamble component of a second time duration that is longer than the first time duration, measured in clock cycles of the clock signal.

5. The integrated circuit memory device of claim 1 wherein:
    for the first mode of operation, the interface is operable to receive write data bits at a first data rate; and
    for the second mode of operation, the interface is operable to receive write data bits at a second data rate that is greater than the first data rate.

6. The integrated circuit memory device of claim 1 wherein:
    the clock signal and the strobe signal originate from a memory controller integrated circuit.

7. The integrated circuit memory device of claim 1 realized as an LPDDR-type DRAM.

8. The integrated circuit memory device of claim 1 and further including:
    a semiconductor substrate having oppositely disposed first and second edges;
    at least one contact pad disposed adjacent the first edge to receive the clock; and
    at least one second contact pad disposed adjacent the second edge to receive the strobe.

9. The integrated circuit memory device of claim 1 wherein the deserializer comprises:
    a serial-parallel shift register circuit including
        an input series of registers to receive the sampled serial write data,
        a control signal input to receive the control signal, and
        an output latch responsive to the control signal for loading data from the input series of registers as a parallel data word.

10. A method of operation in a memory device, the method comprising:
    receiving serial write data accompanied by a data strobe signal;
    sampling the serial write data with a timing signal based on the data strobe signal;
    deserializing the sampled write data as parallel data for transfer to a memory core clocked with reference to a clock signal, wherein in a first mode, deserializing as parallel data is carried out in response to a control signal generated with respect to the clock signal, and in a second mode, deserializing as parallel data is carried out in response to the control signal generated with respect to the data strobe signal.

11. The method of claim 10 further comprising:

selecting between the first mode or the second mode based on a value of a mode select signal.

12. The method of claim 11 further comprising:

storing the mode select signal on the memory device.

13. The method of claim 10 wherein:

in the first mode, the data strobe signal exhibits a first preamble component having a first interval width, measured in clock cycles of the clock signal; and in the second mode, the data strobe signal exhibits a second preamble component having a second interval width different than the first interval width, measured in clock cycles of the clock signal.

14. The method of claim 10 wherein:

in the first mode, the receiving is carried out at a first data rate; and in the second mode, the receiving is carried out at a second rate that is greater than the first data rate.

15. An integrated circuit memory controller comprising:

clock generation circuitry operable to generate and transmit a clock signal to a DRAM;

strobe generation circuitry operable to generate and transmit a strobe signal to a DRAM to accompany write data;

transmit circuitry operable to transmit a mode select signal to a DRAM, the mode select signal having a first value indicating a first mode of operation, and a second value indicating a second mode of operation;

wherein the memory controller generates a preamble component that is longer, as measured in clock cycles of the clock signal, in the second mode of operation than in the first mode of operation.

16. The integrated circuit memory controller of claim 15 wherein:

in the first mode, the write data is transmitted at a first data rate; and in the second mode, the write data is transmitted at a second data rate higher than the first data rate.

17. The integrated circuit memory controller of claim 15 wherein:

the mode select signal indicates to the DRAM a range of operating conditions for at least one of the first and second modes of operation.

18. A deserializer circuit for use in an integrated circuit memory device, the deserializer circuit including:

a serial-parallel shift register circuit including an input series of registers to receive a serial stream of write data, a control signal input to receive a control signal, and an output latch responsive to the control signal for loading data from the input series of registers as a parallel data word, wherein in a first mode, the control signal is referenced to a first timing domain, and in a second mode, the control signal is referenced to a second timing domain.

* * * * *